(12) United States Patent
Yamabe

(10) Patent No.: US 6,498,473 B1
(45) Date of Patent: Dec. 24, 2002

(54) PIN ELECTRONICS HAVING CURRENT MEASURING UNIT AND TESTING APPARATUS HAVING PIN ELECTRONICS THEREOF

(75) Inventor: Masahiko Yamabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 45 days.

(21) Appl. No.: 09/677,784

(22) Filed: Oct. 2, 2000

(30) Foreign Application Priority Data

Oct. 1, 1999 (JP) .............................. 11-282175

(51) Int. Cl.$^7$ ................................ G06F 11/00
(52) U.S. Cl. ...................... 324/158.1; 324/765
(58) Field of Search ............... 324/763, 73.1, 324/158.1, 551, 512–513, 765; 326/30, 62, 90; 714/736, 724

(56) References Cited

U.S. PATENT DOCUMENTS

| | | | | |
|---|---|---|---|---|
| 4,523,312 A | * | 6/1985 | Takeuchi | 714/736 |
| 5,200,696 A | * | 4/1993 | Menis et al. | 324/73.1 |
| 6,133,725 A | * | 10/2000 | Bowhers | 324/158.1 |
| 6,275,023 B1 | * | 8/2001 | Oosaki et al. | 324/158.1 |

* cited by examiner

Primary Examiner—Vinh P. Nguyen
(74) Attorney, Agent, or Firm—Rosenthal & Osha L.L.P.

(57) ABSTRACT

A pin electronics, which inputs and outputs signal from and to an input/output pin of an electric part, provided in a testing apparatus that tests the electric part; including: a current source which outputs desired electric current; a first voltage generator which generates a desired voltage; and a diode bridge, which is connected to each of the current source, the first voltage generator, and the input/output pin of the electric part, that provides the desired electric current to the electric part and provides the desired voltage to the electric part; wherein: the first voltage generator has a current measuring unit that measures an electric current, which is input from the first voltage generator to the diode bridge.

9 Claims, 5 Drawing Sheets

PIN ELECTRONICS HAVING CURRENT MEASURING UNIT AND TESTING APPARATUS HAVING PIN ELECTRONICS THEREOF

This patent application claims priority based on a Japanese patent application, H11-282175 filed on Oct. 1st, 1999, the contents of which are incorporated herein by reference.

BACKGROUND OF THE INVENTION

1. Field of the Invention

The present invention relates to a testing apparatus for testing electric parts. More particularly, the present invention relates to pin electronics that input and output signal from and to input/output pins of the electric parts.

2. Description of the Related Art

FIG. 1 shows a block diagram of a conventional testing apparatus 100. The testing apparatus 100 judges whether an electronic part 16 is normal or not by applying a predetermined signal on the electronic part 16. For example, the electronic part 16 is part that performs a predetermined action according to an electric current or a voltage. The electronic part 16 includes not only a semiconductor part constructed by an active element such as an IC (Integrated circuit) or an LSI (Large-Scale Integrated circuit) but also a passive element, and several kinds of sensors. The electronic part 16 further includes a part that accommodates the above mentioned parts, which are coupled with each other, into one package or a part such as a breadboard that realize a predetermined function by mounting the above mentioned parts on a printed substrate.

On the transmission path of a signal from an input/output pin of the electronic part 16 to a driver 20, the testing apparatus 100 has a programmable load 24, a driver 20, a clamp unit 26, and a switch 28. The programmable load 24 provides a predetermined load to the electronic part 16 according to the output value of the electronic part 16. The clamp unit 26 controls a voltage at the input/output pin of the electronic part 16 in order to protect the driver 20, the judging unit 22 and the programmable load 24. The switch 28 connects the electronic part 16 and a DC measuring unit 14 when performing a voltage applying current measuring test, which applies a voltage on the electronic part 16 to measure a current, or performing an electric current applying voltage measuring test, which applies an electric current on the electronic part 16 to measure a voltage.

If the DC measuring unit 14 is provided for all of the input/output pins of the electronic part 16, the magnitude of the circuit becomes large, and thus the DC measuring unit 14 is not provided for all the input/output pins of the electronic part 16. Therefore, the voltage applying current measuring test or the current applying voltage measuring test could not be performed at the same time on the input/output pin of the electronic part 16. Furthermore, a floating capacity increases by providing the DC measuring unit 14 on the transmission path, thus causing a decrease of measuring accuracy at the time of AC testing.

SUMMARY OF THE INVENTION

Therefore, it is an object of the present invention to provide a pin electronics and a testing apparatus, which overcomes the above issues in the related art. This object is achieved by combinations described in the independent claims. The dependent claims define further advantageous and exemplary combinations of the present invention.

According to the first aspect of the present invention, a pin electronics, which inputs and outputs signal from and to an input/output pin of an electric part, provided in a testing apparatus that tests the electric part comprises: a current source which outputs desired electric current; a first voltage generator which generates a desired voltage; and a diode bridge, which is connected to each of the current source, the first voltage generator, and the input/output pin of the electric part, that provides the desired electric current to the electric part and provides the desired voltage to the electric part; wherein: the first voltage generator has a current measuring unit that measures an electric current, which is input from the first voltage generator to the diode bridge.

The current source may have a first current source that outputs the desired electric current to the diode bridge and a second current source that inputs the desired electric current from the diode bridge; and the pin electronics may further comprise: a control unit that controls the first current source to output a predetermined electric current and controls the second current source to input the predetermined electric current from the diode bridge when measuring an electric current, which is input to the electric part, by applying a predetermined voltage on the input/output pin. The first voltage generator may be provided corresponding to each of the input/output pins of the electric part.

The pin electronics may further comprise: a clamp unit that compensates for an output value of the electric part; and a comparator, which judges an output voltage output from the electric part; wherein: the clamp unit includes: a second voltage generator which generates a voltage to be provided to the electric part; a current generator which generates desired current; a switch that selects a voltage, which is generated by the second voltage generator, o, a the desired electric current generated by the current generator to be provided to the electric part; and the control unit controls the switch to select the current generator to provide the desired electric current to the electric part and controls the comparator to judge the output voltage when measuring the output voltage by applying the desired electric current on the electric part.

The control unit may stop provision of an electric current provided from the first current-source and the second current source to the diode bridge, when measuring the output voltage by applying the desired electric current on the electric part. The reference voltage source may provide a reference voltage whilst changing the reference voltage one after another, and the comparator compares the reference voltage, which is changed one after another, with the output voltage and judges that the output voltage has a voltage value equal to a voltage value of the reference voltage when the reference voltage matches the output voltage, when measuring the output voltage by applying the desired electric current on the electric part.

According to the second aspect of the present invention, a pin electronics, which inputs and outputs signal from and to an input/output pin of an electric part, provided in a testing apparatus that tests the electric part; comprises: a clamp unit which compensates for an output value of the electric part; wherein: the clamp unit includes: a voltage generator which generates a voltage to be provided to the electric part; a current generator which generates desired current; a switch that selects to provide a voltage, which is generated by the voltage generator, to the electric part or to provide the desired electric current generated by the current generator to the electric part; and the pin electronics further comprises: a comparator, which judges an output voltage output from the electric part; and a control unit that controls the switch to select the current generator to provide the desired electric current to the electric part and controls the comparator to judge the output voltage when measuring the output voltage by applying the desired electric current on the electric part.

According to the third aspect of the present invention, a testing apparatus for testing whether an electric part is normal or not, comprises: a pattern generator that generates a test pattern to be applied to the electric part and an expectation value, which is to be output when the electric part is normal; a pin electronics that outputs the test pattern to the electric part and inputs an output value of the electric part; a comparison unit that compares the expectation value and the output value, which is provided via the pin electronics, and judges whether the electronic part is normal or not; wherein: the pin electronics may have: a current source that outputs desired current; a voltage generator that generates desired voltage; and a diode bridge, which is connected to each of the current source, the voltage generator, and the input/output pin of the electric part, that provides the desired electric current to the electric part and provides the desired voltage to the electric part; and the voltage generator has a current measuring unit that measures an electric current, which is input from the voltage generator to the diode bridge.

According to the fourth aspect of the present invention, a testing apparatus for testing whether an electric part is normal or not, comprises: a pattern generator that generates a test pattern to be applied to the electric part and an expectation value to be output when the electric parts is normal; a pin electronics that outputs the test pattern to the electric part and inputs an output value of the electric part; a comparison unit that compares the expectation value and the output value, which is provided via the pin electronics, and judges whether the electronic part is normal or not; wherein: the pin electronics has: a clamp unit which compensates for an output value of the electric part; and a comparator, which judges an output voltage output from the electric part; wherein: the clamp unit includes: a voltage generator which generates a voltage to be provided to the electric part; a current generator which generates a desired current; a switch that selects whether to provide a voltage, which is generated by the voltage generator, to the electric part or to provide the desired electric current generated by the current generator to the electric part; and the testing apparatus further comprising a control unit that controls the switch to select the current generator to provide the desired electric current to the electric part and controls the comparator to judge the output voltage when measuring the output voltage by applying the desired electric current on the electric part.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 2:
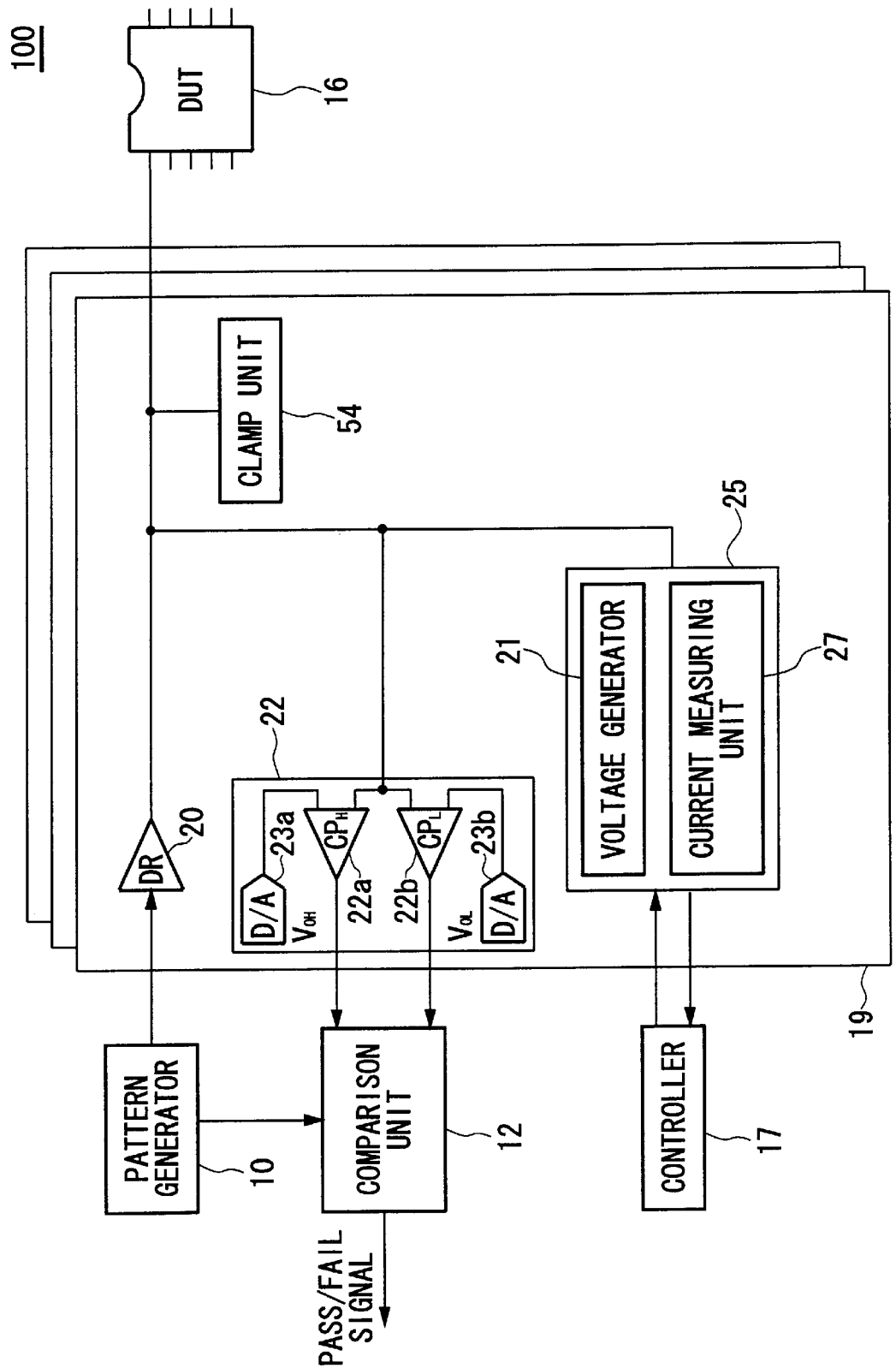
FIG. 2 shows an embodiment of a testing apparatus 100 of the present invention.

FIG. 2 shows an embodiment of a testing apparatus 100 that tests an electronic part 16. The testing apparatus 100 has a pattern generator 10, a comparison unit 12, a controller 17, and pin electronics 19. The pin electronics 19 has a driver 20, a judging unit 22, a programmable load 25, and a clamp unit 54. The judging unit 22 judges whether an output voltage of the electronic part 16 has high level electric potential, which has a logic value of "1", or low level electric potential, which has a logic value of "0".

The judging unit 22 has a reference voltage source 23a, a reference voltage source 23b, a comparator 22a, and a comparator 22b. The reference voltage source 23a generates a first reference voltage used for judging a high level electric potential. The reference voltage source 23b generates a second reference voltage used for judging a low level electric potential. The comparator 22a compares an output voltage of the electronic part 16 and the first reference voltage. The comparator 22b compares an output voltage of the electronic part 16 and the second reference voltage. The programmable load 25 has a voltage generator 21, which generates a desired voltage, and a current measuring unit 27 which measures an electric current.

The pattern generator 10 outputs to the driver 20 a test pattern used for testing the electronic part 16, and outputs to the comparison unit 12 an expectation value, which is to be output from a normal electronic part 16 into which a test pattern is input. The driver 20 applies a test pattern to the electronic part 16. The clamp unit 54 prevents a voltage, which is larger than an allowable input voltage, to be applied to the driver 20, the judging unit 22, and the programmable load 25 which would destroy the driver 20, the judging unit 22, and the programmable load 25. The range of the voltage, which can be input to the driver 20, the judging unit 22, and the programmable load 25 without destroying the driver 20, the judging unit 22, and the programmable load 25, is defined as the allowable input voltage.

The judging unit 22 judges a logic value based on the voltage provided from the electronic part 16 and outputs the judged logic value to the comparison unit 12. The comparison unit 12 compares the expectation value provided from the pattern generator 10 and the output value of the electronic part 16 provided from the judging unit 22, and judges whether the electronic part 16 is normal or not.

The programmable load 25 provides a predetermined load on the electronic part 16 based on the output voltage of the electronic part 16. Moreover, the voltage generator 21 applies a predetermined voltage to the electronic part 16 when performing a voltage applying current measuring test. The current measuring unit 27 measures an electric current input to the electronic part 16. The controller 17, which controls the testing apparatus 100, controls the programmable load 25 according to whether a predetermined load is provided to the electronic part 16 based on the output voltage of the electronic part 16, or the voltage applying current measuring test is being performed.

Figure 3:
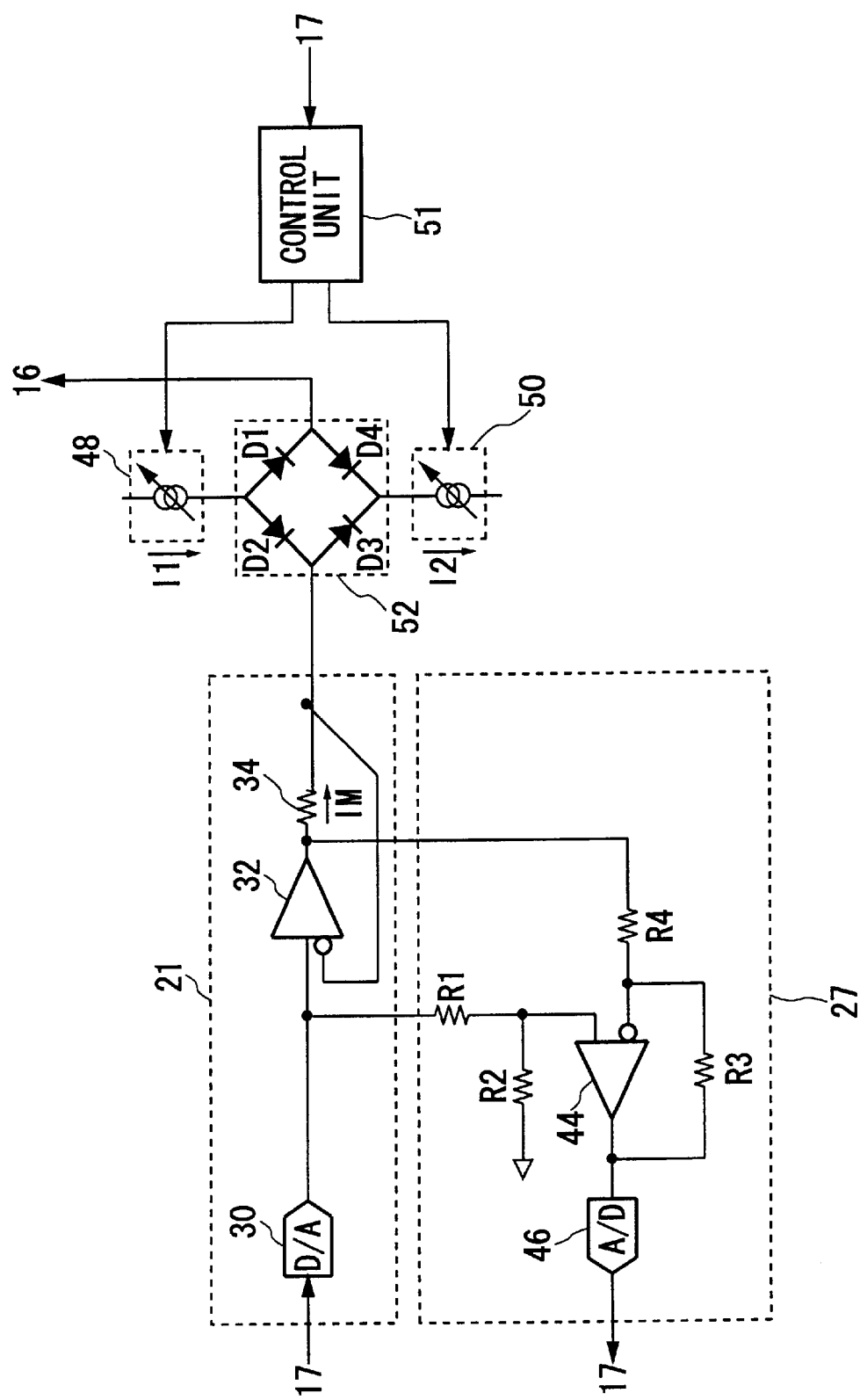
FIG. 3 shows an embodiment of a programmable load 25.

FIG. 3 shows an embodiment of a programmable load 25. The programmable load 25 has a voltage generator 21, a current measuring unit 27, a first current source 48, a second current source 50, a control unit 51, and a diode bridge 52.

The voltage generator 21 has a D/A convertor 30, an operational amplifier 32, and a current measurement resistor 34. The current measuring unit 27 includes an operational amplifier 44, resistors R1, R2, R3, and R4 and an A/D convertor 46.

The D/A convertor 30 generates a predetermined voltage, which is set by the controller 17, and outputs the predetermined voltage to the noninverting input terminal of the operational amplifier 32. Because the output of the operational amplifier 32 is negatively fed back to the inverting input terminal, the operational amplifier 32 outputs a voltage so that the voltage applied to the diode bridge 52 via the current measurement resistor 34, and the predetermined voltage provided from the D/A convertor 30 become equal. Therefore, the voltage generator 21 can output the predetermined voltage set by the D/A convertor 30 to the diode bridge 52.

The operational amplifier 44 amplifies the potential difference between the noninverting input terminal of the operational amplifier 32 and the output terminal of the operational amplifier 32, and outputs the amplified potential difference to the A/D convertor 46. The potential difference between the noninverting-input terminal and the output terminal of the operational amplifier 32 is equal to the voltage drop caused at the current measurement resistor 34.

In the other embodiment, the operational amplifier 44 may amplify the potential difference at both ends of the current measurement resistor 34 and output the potential difference to the A/D convertor 46. The A/D convertor 46 converts the voltage provided from the operational amplifier 44 to a digital signal and outputs the digital signal to the controller 17. The controller 17 calculates an electric current, which flows through the current measurement resistor 34, based on the digital signal, which shows a voltage provided from the A/D convertor 46, and a resistance value of the current measurement resistor 34. Therefore, the current measuring unit 27 can calculate the electric current flowing into the diode bridge 52 by measuring the voltage drop caused by the current measurement resistor 34.

The diode bridge 52 has diodes D1, D2, D3, and D4. The diode bridge 52 is connected to the voltage generator 21, a first current source 48 that outputs desired electric current, the second current source 50, and the electronic part 16. The control unit 51 sets an electric current that is output from the first current source 48 and the second current source 50 based on the signal provided from the controller 17; In the other embodiment, the control unit 51 may be a controller 17. The controller 17 may control the first current source 48 and the second current source 50. For example, the control unit 51 may be a logic or a CPU, which is controlled by the program.

The programmable load provides a predetermined load to the electronic part 16 according to each high level potential, the logic value of which is "1", and low level potential, the logic value of which is "0", output from the electronic part 16. When the programmable load 25 is used as a programmable load described above, the control unit 51 sets a load current, which is to be provided to the electronic part 16 when the electronic part 16 outputs the low level potential (logic value "0"), on the first current source 48. Furthermore, the control unit 51 sets a load current, which is to be provided to the electronic part 16 when the electronic part 16 outputs the high level potential (logic value "1"), on the second current source 50.

Moreover, the voltage generator 21 generates a voltage, which is equal to the threshold potential of the electronic part 16, and outputs the generated voltage to the diode bridge 52. The diode bridge 52 outputs the load current, which is generated by either one of the first current source 48 or the second current source 50, based on the voltage provided from the voltage generator 21 and the voltage provided from the electronic part 16.

For example, if the voltage provided from the electronic part 16 is lower than the voltage provided from the voltage generator 21, the first current source 48 outputs a load current to the electronic part 16 via the diode D1. Moreover, if the voltage provided from the electronic part 16 is higher than the voltage provided from the voltage generator 21, an electric current flows into the second current source 50 via the diode D4 of the diode bridge 52. Therefore, the voltage generator 21 applies the voltage, which is equal to the threshold voltage of the electronic part 16, to the diode bridge 52. The control unit 51 sets the load current on each of the first current source 48 and the second current source 50 according to the output voltage of the electronic part 16. The programmable load 25 thereby functions as a programmable load.

When performing the voltage applying current measuring test, the control unit 51 controls the first current source 48 to output a predetermined electric current and controls the second current source 50 to input the electric current equal to the electric current output from the first current source 48. The voltage generator 21 applies a predetermined voltage to the diode bridge 52. For example, the predetermined voltage is preferably within a range of an allowable input voltage of the electronic part 16 and within a range of the allowable input voltage of the driver 20 and the judging unit 22. Furthermore, the predetermined voltage may be within a range of −4V and 8V. Moreover, in the other embodiment, a switch may be provided so that a voltage cannot be provided to the driver 20 and the judging unit 22 during the voltage applying current measuring test, and the voltage generator 21 may apply the predetermined voltage to the diode bridge 52 within a range of the allowable input voltage of the electronic part 16.

Because the diode bridge 52 makes the input current and the output current constant, an electric current, which is equal to the electric current input and output to the electronic part 16, is input and output from the voltage generator 21 to the diode bridge 52. Therefore, the electric current input to the electronic part 16 can be measured by measuring the voltage drop caused by the current measurement resistor 34 and calculating the electric current based on the measured voltage drop. Therefore, the voltage applying current measuring test can be performed by the configuration of the voltage generator 21 and the current measuring unit 27.

Furthermore, because the voltage generator 21 is used jointly for both a programmable load and the voltage applying current measuring test, the number of parts can be reduced. Furthermore, because the number of the parts can be reduced, the voltage generator 21 and the current measuring unit 27 can be provided corresponding to all of the input/output pins of the electronic part 16. The voltage applying current measuring test can thereby be performed for all input/output pins of the electronic part 16 at the same time. For example, when the electronic part 16 has 1024 input/output pins, the voltage applying current measuring test can be performed for all 1024 pins at the same time.

Figure 1:
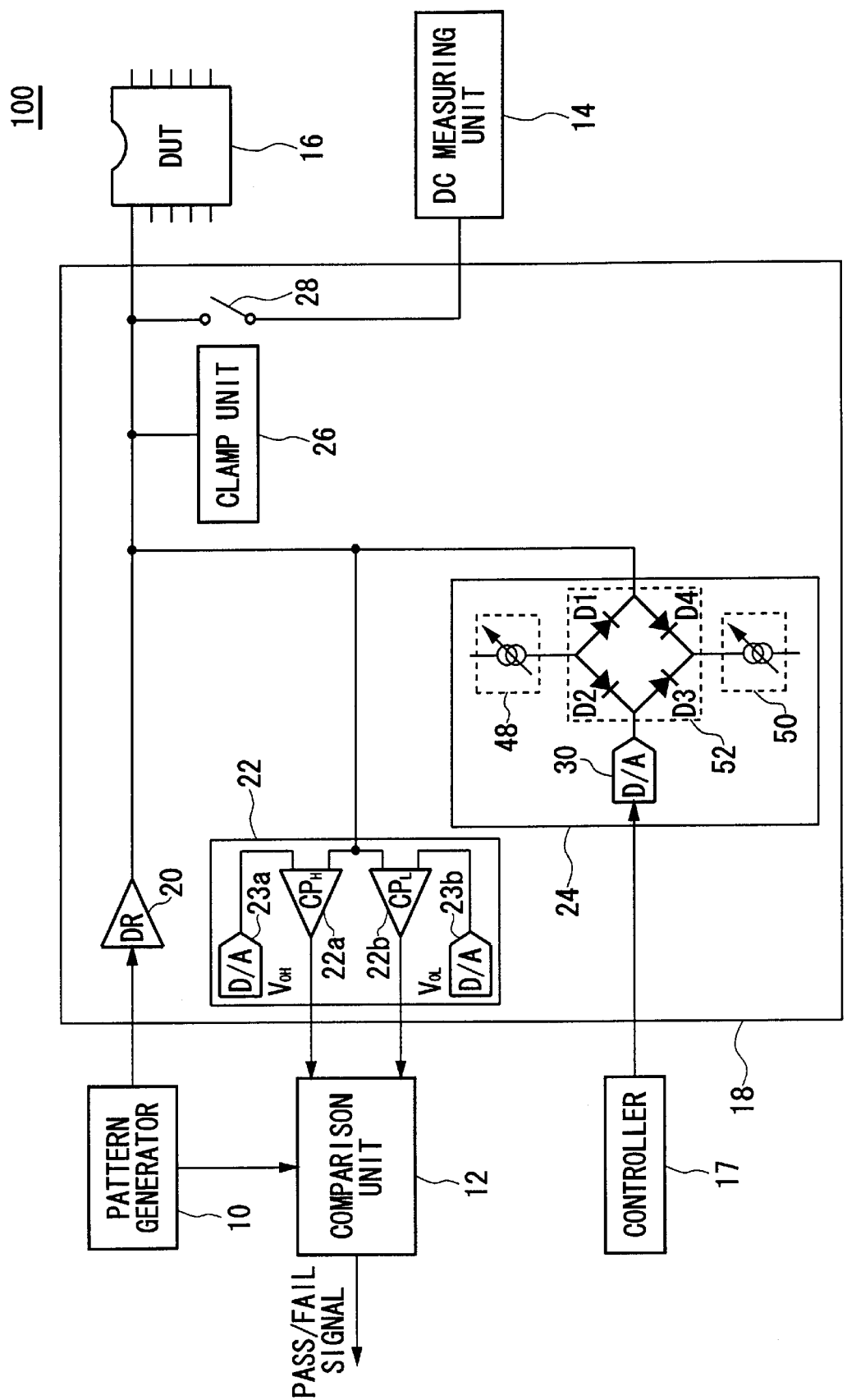
FIG. 1 shows a conventional testing apparatus 100.

Furthermore, the switch 28 and the DC measuring unit 14, which are explained using FIG. 1, become unnecessary on the transmission path from the electronic part 16 to the judging unit 22, and a floating capacity in the transmission path can be reduced. Because the floating capacity can be reduced, the electronic part 16 can be tested accurately. Moreover, the load current provided to the electronic part 16 can be measured when the programmable load 25 is used as programmable load.

Figure 4:
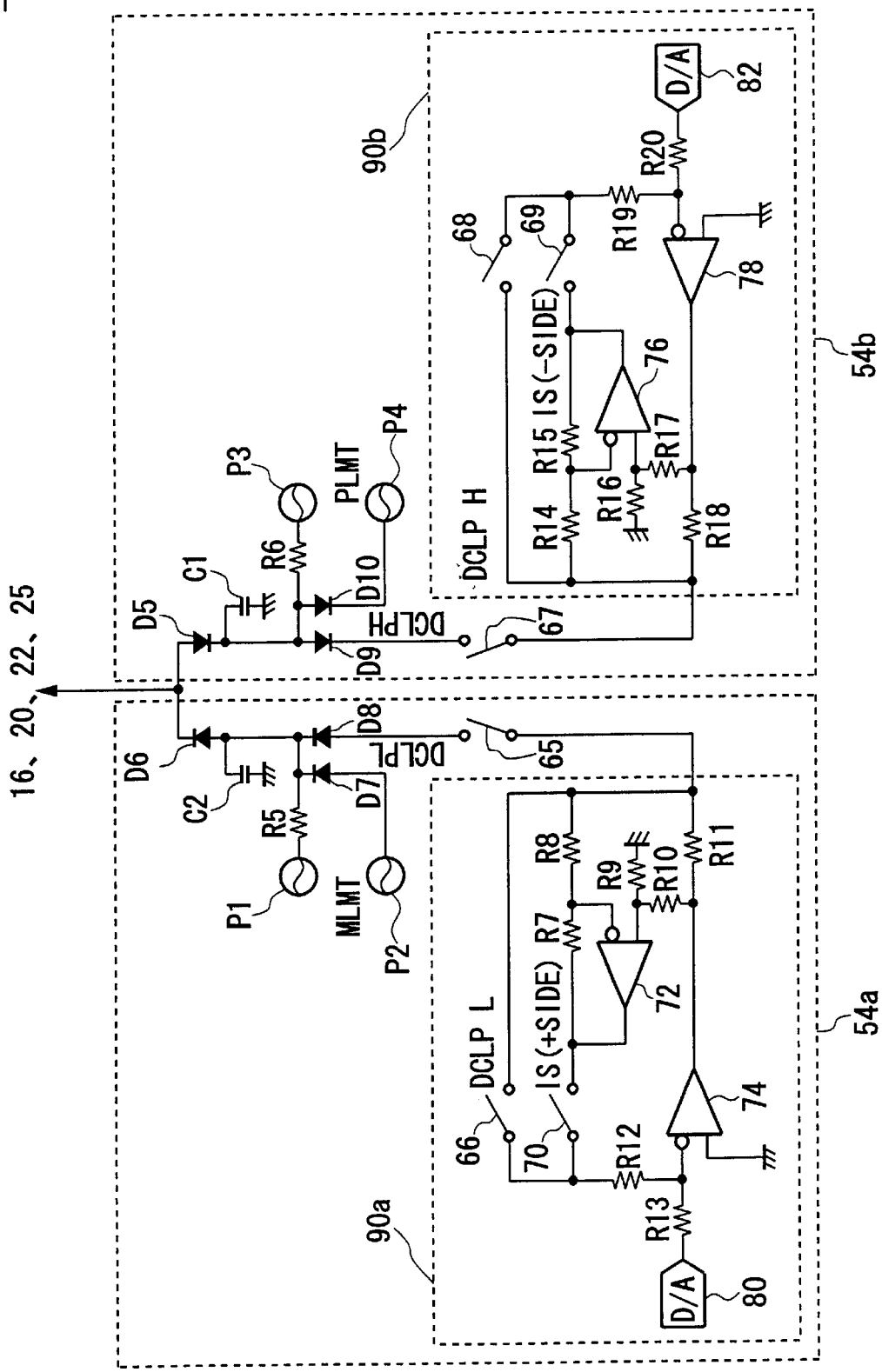
FIG. 4 shows an embodiment of a clamp unit 54.

FIG. 4 shows an embodiment of the clamp unit 54. The clamp unit 54 has a first clamp unit 54a and a second clamp unit 54b. The first clamp unit 54a has a first dynamic clamp unit 90a, a switch 65, and a voltage source P1 and P2. The first dynamic clamp unit 90a has operational amplifiers 72 and 74, switches 66 and 70, and a D/A convertor 80. The second clamp unit 54b has a second dynamic clamp unit 90b, a switch 67, and voltage sources P3 and P4. The second dynamic clamp unit 90b has operational amplifiers 76 and 78, switches 68 and 69, and a D/A convertor 82.

If the voltage at the input/output pin of the electronic part 16 is lower than the minimum allowable input voltage of the driver 20, the judging unit 22, and the programmable load 25, the first clamp unit 54a outputs a first voltage to the electronic part 16 so that the voltage at the input/output pin of the electronic part 16 does not become lower than the minimum allowable voltage. If the voltage at the input/output pin of the electronic part 16 is higher than the maximum allowable input voltage, the second clamp unit 54b provides a second voltage to the electronic part 16 so that the voltage at the input/output pin of the electronic part 16 does not become higher than the maximum allowable input voltage.

The configuration of the clamp unit 54 will be explained below. The capacitor C2 is provided to the first clamp unit 54a for reducing the fluctuation of the voltage in the first clamp unit 54a. The voltage source P2 generates the first voltage. For example, the first voltage is preferably a voltage higher than the minimum allowable input voltage of the driver 20, the judging unit 22, and the programmable load 25. Because the first clamp unit 54a outputs an electric current when the voltage at the input/output pin of the electronic part 16 is lower than the first voltage, the first clamp unit 54a can make the voltage at the input/output pin of the electronic part 16 higher than the first voltage.

Therefore, the clamp unit 54 can prevent the driver 20, the judging unit 22, and the programmable load 25 from being destroyed owing to the voltage at the input/output pin of the electronic part 16 being lower than the allowable input voltage of the driver 20, the judging unit 22, and the programmable load 25. Preferably, the voltage source P1 generates a voltage lower than the voltage source P2, thereby an electric current flows from the voltage source P2 to the voltage source P1 so that the voltage at the diode D7 is stable.

When the first dynamic clamp unit 90a is used to compensate for the distortion of the output value of the electronic part 16 caused by the difference between the impedance in the transmission path and the output impedance of the electronic part 16, the switches 65 and 66 are closed, and the switch 70 is opened. When performing the current applying voltage measuring test, the switches 65 and 70 are closed, and the switch 66 is opened. If the switch 70 is closed, a current generator, which has the D/A convertor 80, the operational amplifier 72 and 74 and resistors R7, R8, R9, R10, R11, R12, and R13, is formed. The D/A convertor 80 outputs a predetermined voltage to the inverse input terminal of the operational amplifier 74.

The operational amplifier 72 feed backs the voltage obtained by differentially amplifying the voltage at both ends of the resistor R11, to the operational amplifier 74. Threrefore, the current generator outputs constant current. The constant current generated by the current generator is provided to the electronic part 16 via the switch 65, and the diodes D8 and D6. The judging unit 22 judges the voltage value at the input/output pin of the electronic part 16. The method of judgement will be described later.

Moreover, in the case of performing the current applying voltage measuring test, the control unit 51, which is explained using FIG. 3, provides a signal that orders the first current source 48 and the second current source 50 to stop the output of an electric current. Then, the first current source 48 and the second current source 50 stop the provision of an electric current to the diode bridge 52 based on the signal output from the control unit 51. Because an electric current is not provided to the diode bridge 52, the voltage generator 21 and the current measuring unit 27 can be cut off electrically. Therefore, the test can be performed with higher accuracy than the test performed without electrically cutting off the voltage generator 21 and the current measuring unit 27.

In the case of performing the current applying voltage measuring test, the first clamp unit 54a applies a positive electric current to the electronic part 16, and the second clamp unit 54b applies a negative electric current to the electronic part 16. The functions and the operation of the second clamp unit 54b can be easily understood by those skilled in the art based on the function and the operation of the first clamp unit 54a, therefore the explanation will be abbreviated.

If the first clamp unit 54a applies an electric current to the electronic part 16, the second clamp unit 54b does not apply an electric current to the electronic part 16. Furthermore, if the second clamp unit 54b applies an electric current to the electronic part 16, the first clamp unit 54a does not apply an electric current to the electronic part 16. For example, when the switches 70 and 65 are closed, the switch 69 is opened. Moreover, the opening and closing operation of the switches 65, 66, 67, 68, 69, and 70 is preferably controlled by the control unit 51, not shown in FIG. 4. In the other embodiment, the opening and closing operation of the switches 65, 66, 67, 68, 69, and 70 may be controlled by the controller 17. For example, the control unit 51 can be a logic or a CPU, which is controlled by a program.

The D/A convertor 80 can be used jointly for both a dynamic clamp and the current applying voltage measuring test, and the number of parts can thereby be reduced. Furthermore, because the number of parts in the current generator is reduced, the current generator can be provided to all of the corresponding input/output pins of the electronic part 16 so that the current applying voltage measuring test can be performed at the same time for all the input/output pins of the electronic part 16. For example, if the electronic part 16 has 1024 input/output pins, a voltage can be measured for all 1024 input/output pins at the same time. Furthermore, because the switch 28 and the DC measuring unit 14, which are explained using FIG. 1, become unnecessary on the transmission path from the electronic part 16 to the judging unit 22, a floating capacity in the transmission path can be reduced. Because the floating capacity can be reduced, the electronic part 16 can be tested with high accuracy.

Figure 5:
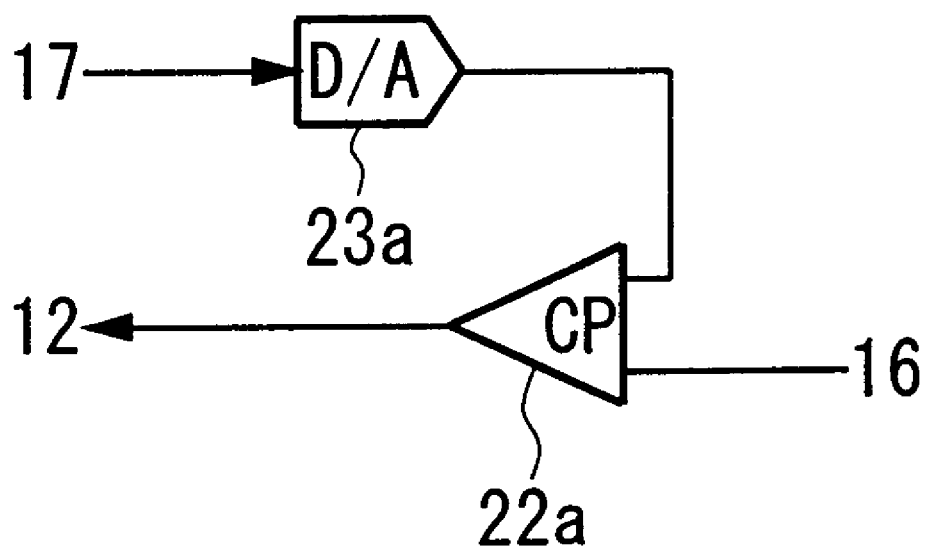
FIG. 5 shows a judging unit 22.

FIG. 5 shows a comparator 22a and a reference voltage source 23a included in a judging unit 22. The voltage at the input/output pin of the electronic part 16 when a constant current is applied to the input/output pin of the electronic part 16 during performing the current applying voltage measuring test, is input to the comparator 22a. The reference voltage source changes a reference voltage one after another and outputs the reference voltage to the comparator 22a based on the signal output from the controller 17. The comparator 22a compares the voltage at the input/output pin provided from the electronic part 16 and the reference voltage provided from the reference voltage source 23a. Therefore, the judging unit 22 can judge the voltage at the input/output pin of the electronic part 16 by judging whether the voltage at the input/output pin of the electronic part 16 matches the reference voltage.

Although the present invention has been described by way of exemplary embodiments, it should be understood that many changes and substitutions may be made by those skilled in the art without departing from the spirit and the scope of the present invention which is defined only by the appended claims.

What is claimed is:

1. A pin electronics, which inputs and outputs signal from and to an input/output pin of an electric part, provided in a testing apparatus that tests said electric part; comprising:
    a current source which outputs desired electric current;
    a first voltage generator which generates a desired voltage; and
    a diode bridge, which is connected to each of said current source, said first voltage generator, and said input/output pin of said electric part, that provides said desired electric current to said electric part and provides said desired voltage to said electric part; wherein:
        said first voltage generator has a current measuring unit that measures an electric current, which is input from said first voltage generator to said diode bridge; and
        said first voltage generator being connected to one terminal of said diode bridge that is different than a terminal to which said input/output pin of said electric part is connected.

2. A pin electronics as claimed in claim 1, wherein:
    said current source has a first current source that outputs said desired electric current to said diode bridge and a second current source that inputs said desired electric current from said diode bridge; and
    said pin electronics further comprising:
        a control unit that controls said first current source to output a predetermined electric current and controls said second current source to input said predetermined electric current from said diode bridge when measuring an electric current, which is input to said electric part, by applying a predetermined voltage on said input/output pin.

3. A pin electronics as claimed in claim 1 or claim 2, wherein said first voltage generator is provided corresponding to each of said input/output pins of said electric part.

4. A pin electronics as claimed in claim 2, further comprising:
    a clamp unit that compensates for an output value of said electric part; and
    a comparator, which judges an output voltage output from said electric part; wherein:
        said clamp unit includes:
            a second voltage generator which generates a voltage to be provided to said electric part;
            a current generator which generates desired current;
            a switch that connects or disconnects said current generator to said electric part; and
        said control unit controls said switch to connect said current generator to said electric part to provide said desired electric current to said electric part and controls said comparator to judge said output voltage when measuring said output voltage by applying said desired electric current on said electric part.

5. A pin electronics as claimed in claim 2, wherein said control unit stops provision of an electric current provided from said first current source and said second current source to said diode bridge, when measuring said output voltage by applying said desired electric current on said electric part.

6. A pin electronics as claimed in claim 4, further comprising a reference voltage source that provides a reference voltage whilst changing said reference voltage one after another, and said comparator compares said reference voltage, which is changed one after another, with said output voltage and judges that said output voltage has a voltage value equal to a voltage value of said reference voltage when said reference voltage matches said output voltage, when measuring said output voltage by applying said desired electric current on said electric part.

7. A pin electronics, which inputs and outputs signal from and to an input/output pin of an electric part, provided in a testing apparatus that tests said electric part; comprising:
    a clamp unit which compensates for an output value of said electric part; wherein:
        said clamp unit includes:
            a voltage generator which generates a voltage to be provided to said electric part;
            a current generator which generates desired current;
            a switch that connects or disconnects said current generator to said electric part; and
        said pin electronics further comprising:
            a comparator, which judges an output voltage output from said electric part; and
            a control unit that controls said switch to connect said current generator to said electric part to provide said desired electric current to said electric part and controls said comparator to judge said output voltage when measuring said output voltage by applying said desired electric current on said electric part.

8. A testing apparatus for testing whether an electric part is normal or not, comprising:
    a pattern generator that generates a test pattern to be applied to said electric part and an expectation value, which is to be output when said electric part is normal;
    a pin electronics that outputs said test pattern to said electric part and inputs an output value of said electric part;
    a comparison unit that compares said expectation value and said output value, which is provided via said pin electronics, and judges whether said electronic part is normal or not; wherein:
        said pin electronics has:
            a current source that outputs desired current;
            a voltage generator that generates desired voltage; and
            a diode bridge, which is connected to each of said current source, said voltage generator, and said input/output pin of said electric part, that provides said desired electric current to said electric part and provides said desired voltage to said electric part;
            said voltage generator has a current measuring unit that measures an electric current, which is input from said voltage generator to said diode bridge; and
            said first voltage generator being connected to one of terminals of said diode bridge that is different than said terminal to which said input/output pin of said electric part is connected.

9. A testing apparatus for testing whether an electric part is normal or not, comprising:
- a pattern generator that generates a test pattern to be applied to said electric part and an expectation value to be output when said electric part is normal;
- a pin electronics that outputs said test pattern to said electric part and inputs an output value of said electric part;
- a comparison unit that compares said expectation value and said output value, which is provided via said pin electronics, and judges whether said electronic part is normal or not; wherein:
    said pin electronics has:
        a clamp unit which compensates for an output value of said electric part; and
        a comparator, which judges an output voltage output from said electric part; wherein:
    said clamp unit includes:
        a voltage generator which generates a voltage to be provided to said electric part;
        a current generator which generates a desired current;
        a switch that connects or disconnects said current generator to said electric part; and
said testing apparatus further comprising a control unit that controls said switch to connect said current generator to said electric part to provide said desired electric current to said electric part and controls said comparator to judge said output voltage when measuring said output voltage by applying said desired electric current on said electric part.

* * * * *